United States Patent
Lee et al.

(10) Patent No.: US 7,192,335 B2
(45) Date of Patent: Mar. 20, 2007

(54) METHOD AND APPARATUS FOR CHEMICALLY, MECHANICALLY, AND/OR ELECTROLYTICALLY REMOVING MATERIAL FROM MICROELECTRONIC SUBSTRATES

(75) Inventors: Whonchee Lee, Boise, ID (US); Scott G. Meikle, Gainesville, VA (US)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 10/230,463

(22) Filed: Aug. 29, 2002

(65) Prior Publication Data

US 2004/0043705 A1 Mar. 4, 2004

(51) Int. Cl.
*B24B 1/00* (2006.01)
(52) U.S. Cl. .......................... 451/41; 451/36
(58) Field of Classification Search ................ 451/41, 451/36, 60, 37, 57; 205/662
See application file for complete search history.

(56) References Cited

U.S. PATENT DOCUMENTS

| | | |
|---|---|---|
| 2,315,695 A | 4/1943 | Faust |
| 2,516,105 A | 7/1950 | der Mateosian |
| 3,239,439 A | 3/1966 | Helmke |
| 3,334,210 A | 8/1967 | Williams et al. |
| 4,839,005 A | 6/1989 | Katsumoto et al. |
| 5,098,533 A | 3/1992 | Duke |
| 5,162,248 A | 11/1992 | Dennison et al. |
| 5,244,534 A | 9/1993 | Yu et al. |
| 5,300,155 A | 4/1994 | Sandhu et al. |
| 5,344,539 A | 9/1994 | Shinogi et al. |
| 5,562,529 A | 10/1996 | Kishii et al. |
| 5,567,300 A | 10/1996 | Datta et al. |
| 5,575,885 A | 11/1996 | Hirabayashi et al. |
| 5,618,381 A | 4/1997 | Doan et al. |
| 5,624,300 A | 4/1997 | Kishii et al. |
| 5,676,587 A | 10/1997 | Landers et al. |

(Continued)

FOREIGN PATENT DOCUMENTS

EP 0459397 A2 12/1991

(Continued)

OTHER PUBLICATIONS

PCT Written Opinion dated Jun. 10, 2003 for PCT/US02/19495 filed Jun. 20, 2002 (7 pages).

(Continued)

*Primary Examiner*—Dung Van Nguyen
(74) *Attorney, Agent, or Firm*—Perkins Coie LLP

(57) ABSTRACT

Method and apparatus for chemically, mechanically and/or electrolytically removing material from microelectronic substrates. A polishing medium for removing material can include a liquid carrier, an electrolyte disposed in the liquid carrier, and abrasives disposed in the liquid carrier, with the abrasives forming up to about 1% of the polishing liquid by weight. The polishing medium can further include a chelating agent. An electrical current can be selectively applied to the microelectronic substrate via the polishing liquid, and a downforce applied to the microelectronic substrate can be selected based on the level of current applied electrolytically to the microelectronic substrate. The microelectronic substrate can undergo an electrolytic and nonelectrolytic processing on the same polishing pad, or can be moved from one polishing pad to another while being supported by a single substrate carrier.

59 Claims, 7 Drawing Sheets

U.S. PATENT DOCUMENTS

| | | | |
|---|---|---|---|
| 5,681,423 A | 10/1997 | Sandhu et al. |
| 5,780,358 A | 7/1998 | Zhou et al. |
| 5,807,165 A | 9/1998 | Uzoh et al. |
| 5,840,629 A | 11/1998 | Carpio |
| 5,843,818 A | 12/1998 | Joo et al. |
| 5,846,398 A | 12/1998 | Carpio |
| 5,863,307 A | 1/1999 | Zhou et al. |
| 5,888,866 A | 3/1999 | Chien |
| 5,897,375 A | 4/1999 | Watts et al. |
| 5,911,619 A | 6/1999 | Uzoh et al. |
| 5,930,699 A | 7/1999 | Bhatia |
| 5,934,980 A | 8/1999 | Koos et al. |
| 5,952,687 A | 9/1999 | Kawakubo et al. |
| 5,954,975 A | 9/1999 | Cadien et al. |
| 5,954,997 A | 9/1999 | Kaufman et al. |
| 5,972,792 A | 10/1999 | Hudson |
| 5,993,637 A | 11/1999 | Hisamatsu et al. |
| 6,001,730 A | 12/1999 | Farkas et al. |
| 6,007,695 A | 12/1999 | Knall et al. |
| 6,010,964 A | 1/2000 | Glass |
| 6,024,856 A | 2/2000 | Haydu et al. |
| 6,033,953 A | 3/2000 | Aoki et al. |
| 6,039,633 A | 3/2000 | Chopra |
| 6,046,099 A | 4/2000 | Cadien et al. |
| 6,051,496 A | 4/2000 | Jang |
| 6,060,386 A | 5/2000 | Givens |
| 6,060,395 A | 5/2000 | Skrovan et al. |
| 6,063,306 A | 5/2000 | Kaufman et al. |
| 6,066,030 A | 5/2000 | Uzoh |
| 6,066,559 A | 5/2000 | Gonzalez et al. |
| 6,068,787 A | 5/2000 | Grumbine et al. |
| 6,083,840 A | 7/2000 | Mravic et al. |
| 6,100,197 A | 8/2000 | Hasegawa |
| 6,103,096 A | 8/2000 | Datta et al. |
| 6,103,628 A | 8/2000 | Talieh |
| 6,103,636 A | 8/2000 | Zahorik et al. |
| 6,115,233 A | 9/2000 | Seliskar et al. |
| 6,117,781 A | 9/2000 | Lukanc et al. |
| 6,121,152 A | 9/2000 | Adams et al. |
| 6,132,586 A | 10/2000 | Adams et al. |
| 6,143,155 A | 11/2000 | Adams et al. |
| 6,162,681 A | 12/2000 | Wu |
| 6,171,467 B1 | 1/2001 | Weihs et al. |
| 6,174,425 B1 | 1/2001 | Simpson et al. |
| 6,176,992 B1 | 1/2001 | Talieh |
| 6,180,947 B1 | 1/2001 | Stickel et al. |
| 6,187,651 B1 | 2/2001 | Oh |
| 6,190,494 B1 | 2/2001 | Dow |
| 6,196,899 B1 | 3/2001 | Chopra et al. |
| 6,197,182 B1 | 3/2001 | Kaufman et al. |
| 6,206,756 B1 | 3/2001 | Chopra et al. |
| 6,218,309 B1 | 4/2001 | Miller et al. |
| 6,250,994 B1 | 6/2001 | Chopra et al. |
| 6,259,128 B1 | 7/2001 | Adler et al. |
| 6,273,786 B1 | 8/2001 | Chopra et al. |
| 6,276,996 B1 | 8/2001 | Chopra |
| 6,280,581 B1 | 8/2001 | Cheng |
| 6,287,974 B1 | 9/2001 | Miller |
| 6,299,741 B1 | 10/2001 | Sun et al. |
| 6,303,956 B1 | 10/2001 | Sandhu et al. |
| 6,313,038 B1 | 11/2001 | Chopra et al. |
| 6,322,422 B1 | 11/2001 | Satou |
| 6,328,632 B1 | 12/2001 | Chopra |
| 6,368,184 B1 | 4/2002 | Beckage |
| 6,368,190 B1 | 4/2002 | Easter et al. |
| 6,379,223 B1 | 4/2002 | Sun et al. |
| 6,395,607 B1 | 5/2002 | Chung |
| 6,416,647 B1 | 7/2002 | Dordi et al. |
| 6,455,370 B1 | 9/2002 | Lane |
| 6,461,911 B2 | 10/2002 | Ahn et al. |
| 6,464,855 B1 * | 10/2002 | Chadda et al. | 205/662 |
| 6,504,247 B2 | 1/2003 | Chung |
| 6,620,037 B2 * | 9/2003 | Kaufman et al. | 451/559 |
| 6,689,258 B1 * | 2/2004 | Lansford et al. | 204/224 M |
| 6,693,036 B1 | 2/2004 | Nogami et al. |
| 6,722,942 B1 | 4/2004 | Lansford et al. |
| 6,722,950 B1 | 4/2004 | Dabral et al. |
| 6,736,952 B2 | 5/2004 | Emesh et al. |
| 6,753,250 B1 | 6/2004 | Hill et al. |
| 6,776,693 B2 | 8/2004 | Duboust et al. |
| 6,780,772 B2 | 8/2004 | Uzoh et al. |
| 6,846,227 B2 | 1/2005 | Sato et al. |
| 6,848,970 B2 | 2/2005 | Manens et al. |
| 6,852,630 B2 | 2/2005 | Basol et al. |
| 6,867,136 B2 | 3/2005 | Basol et al. |
| 6,881,664 B2 | 4/2005 | Catabay et al. |
| 6,893,328 B2 | 5/2005 | So |
| 2001/0025976 A1 | 10/2001 | Lee |
| 2001/0036746 A1 | 11/2001 | Sato et al. |
| 2002/0025759 A1 | 2/2002 | Lee et al. |
| 2002/0025760 A1 | 2/2002 | Lee et al. |
| 2002/0025763 A1 | 2/2002 | Lee et al. |
| 2002/0052126 A1 | 5/2002 | Lee et al. |
| 2002/0070126 A1 | 6/2002 | Sato et al. |
| 2002/0104764 A1 * | 8/2002 | Banerjee et al. | 205/662 |
| 2002/0115283 A1 | 8/2002 | Ho et al. |
| 2003/0064669 A1 | 4/2003 | Basol et al. |
| 2003/0178320 A1 | 9/2003 | Liu et al. |
| 2004/0192052 A1 | 9/2004 | Mukherjee et al. |
| 2004/0259479 A1 | 12/2004 | Sevilla |
| 2005/0133379 A1 | 6/2005 | Basol et al. |
| 2005/0173260 A1 | 8/2005 | Basol et al. |
| 2005/0178743 A1 | 8/2005 | Manens et al. |

FOREIGN PATENT DOCUMENTS

| | | |
|---|---|---|
| EP | 0459397 A3 | 12/1991 |
| EP | 1 123 956 A1 | 8/2001 |
| JP | 1-241129 A | 9/1989 |
| JP | 2001077117 A1 | 3/2001 |
| WO | WO 00/26443 A2 | 5/2000 |
| WO | WO 00/26443 A3 | 5/2000 |
| WO | WO 00/28586 A2 | 5/2000 |
| WO | WO 00/28586 A3 | 5/2000 |
| WO | WO 00/32356 A1 | 6/2000 |
| WO | WO 00/59008 A2 | 10/2000 |
| WO | WO 00/59008 A3 | 10/2000 |
| WO | WO 00/59682 A1 | 10/2000 |
| WO | WO 02/064314 A1 | 8/2002 |

OTHER PUBLICATIONS

PCT Written Opinion dated Jun. 10, 2003 for PCT/US02/19496 filed Jun. 20, 2002 (8 pages).

PCT International Search Report dated Jul. 10, 2003 for PCT/US03/06373 filed Feb. 28, 2003 (4 pages).

U.S. Appl. No. 09/653,411, filed Aug. 31, 2000, Lee et al.

Juchniewicz, R. et al. "Influence of Pulsed Current on Platinised Titanium and Tantalum Anode Durability," International Congress on Metallic Corrosion, Proceedings—vol. 3, pp. 449-453, Toronto, Jun. 3-7, 1984.

PCT International Search Report dated Dec. 1, 2003 for PCT/US03/27181 filed Aug. 27, 2003 (7 pages).

PCT International Search Report for PCT/US03/26803, 5 pages, Jan. 22, 2004.

U.S. Appl. No. 09/651,779, filed Aug. 30, 2000, Moore.

U.S. Appl. No. 09/651,808, filed Aug. 30, 2000, Chopra et al.

U.S. Appl. No. 09/653,392, filed Aug. 31, 2000, Chopra et al.

U.S. Appl. No. 10/090,869, filed Mar. 4, 2002, Moore et al.

U.S. Appl. No. 10/230,602, filed Aug. 29, 2002, Chopra.

U.S. Appl. No. 10/230,973, filed Aug. 29, 2002, Chopra.

U.S. Appl. No. 10/230,628, filed Aug. 29, 2002, Lee et al.

U.S. Appl. No. 10/230,970, filed Aug. 29, 2002, Lee et al.

U.S. Appl. No. 10/230,972, filed Aug. 29, 2002, Lee et al.

D'Heurle, F.M. and K.C. Park, IBM Technical Disclosure Bulletin, Electrolytic Process for Metal Pattern Generation, vol. 17, No. 1, pp. 271-272, Jun. 1974, XP-002235691, NN 7406271.

Frankenthal, R.P. and Eaton, D.H., "Electroetching of Platinum in the Titanium—Platinum—Gold Metallization on Silicon Integrated Circuits," Journal of The Electrochemical Society, vol. 123, No. 5, pp. 703-706, May 1976, Pennington, New Jersey.

Aboaf, J.A. and R.W. Broadie, IBM Technical Disclosure Bulletin, Rounding of Square-Shape Holes in Silicon Wafers, vol. 19, No. 8, p. 3042, Jan. 1977, XP-002235690, NN 77013042.

Bassous, E., IBM Technical Disclosure Bulletin, Low Temperature Methods for Rounding Silicon Nozzles, vol. 20, No. 2, Jul. 1977, pp. 810-811, XP-002235692, NN 7707810.

Bernhardt, A.F., R.J. Contolini, and S.T. Mayer, "Electrochemical Planarization for Multi-Level Metallization of Microcircuitry," CircuiTree, vol. 8, No. 10, pp. 38, 40, 42, 44, 46, and 48, Oct. 1995.

McGraw-Hill, "Chemical bonding," Concise Encyclopedia of Science & Technology, Fourth Edition, Sybil P. Parker, Editor in Chief, p. 367, McGraw-Hill, New York, New York, 1998.

PhysicsWorld. Hard Materials (excerpt of Superhard superlattices) [online]. S. Barnett and A. Madan, Physics World, Jan. 1998, Institute of Physics Publishing Ltd., Bristol, United Kingdom. Retrieved from the Internet on Jul. 29, 2002. <URL: http://physicsweb.org/box/world/11/1/11/world-11-1-11-1>.

Huang, C.S. et al., "A Novel UV Baking Process to Improve DUV Photoresist Hardness," pp. 135-138, Proceedings of the 1999 International Symposium on VLSI Technology, Systems, and Applications: Proceedings of Technical Papers: Jun. 8-10, 1999, Taipei, Taiwan, Institute of Electrical and Electronics Engineers, Inc., Sep. 1999.

ATMI, Inc., Internet document, adapted from a presentation at the Semicon West '99 Low Dielectric Materials Technology Conference, San Francisco, California, Jul. 12, 1999, pp. 13-25.

Kondo, S. et al., "Abrasive-Free Polishing for Copper Damascene Interconnection," Journal of the Electrochemical Society, vol. 147, No. 10, pp. 3907-3913, The Electrochemical Society, Inc., Pennington, New Jersey, 2000.

Micro Photonics, Inc. CSM Application Bulletin. Low-load Micro Scratch Tester (MST) for characterisation of thin polymer films [online]. 3 pages. Retrieved from the Internet on Jul. 25, 2002. <URL: http://www.microphotonics.com/mstABpoly.html>.

Micro Photonics, Inc. CSM Nano Hardness Tester [online]. 6 pages. Retrieved from the Internet on Jul. 29, 2002. <URL: http://www.microphotonics.com/nht.html>.

PCT International Search Report, International Application No. PCT/US02/19495, Mar. 31, 2003.

PCT International Search Report, International Application No. PCT/US02/19496, Apr. 4, 2003.

* cited by examiner

METHOD AND APPARATUS FOR CHEMICALLY, MECHANICALLY, AND/OR ELECTROLYTICALLY REMOVING MATERIAL FROM MICROELECTRONIC SUBSTRATES

CROSS-REFERENCE TO RELATED APPLICATIONS

This application is related to the following pending U.S. patent applications, all of which are incorporated herein by reference: Ser. No. 09/651,779, filed Aug. 30, 2000; Ser. No. 09/888,084, filed Jun. 21, 2001; Ser. No. 09/887,767, filed Jun. 21, 2001; and Ser. No. 09/888,002, filed Jun. 21, 2001. This application is also related to the following U.S. patent applications, filed simultaneously herewith and incorporated herein by reference: Ser. No. 10/230,970; Ser. No. 10/230,972; Ser. No. 10/230,973 and Ser. No. 10/230,628.

TECHNICAL FIELD

The present invention relates generally to methods and apparatuses for chemically, mechanically, and/or electrolytically removing materials from microelectronic substrates.

BACKGROUND

Microelectronic substrates and substrate assemblies typically include a semiconductor material having features, such as memory cells, that are linked with conductive lines. The conductive lines can be formed by first forming trenches or other recesses in the semiconductor material and then overlaying a conductive material (such as a metal) in the trenches. The conductive material is then selectively removed to leave conductive lines extending from one feature in the semiconductor material to another.

One technique for forming microelectronic features, such as capacitors, is to dispose the features in isolated containers within the microelectronic substrate. One typical process includes forming an aperture in a substrate material (such as borophosphosilicate glass or BPSG), coating the microelectronic substrate (including the walls of the aperture) first with a barrier layer and then with a conductive layer, and then overfilling the aperture with a generally nonconductive material, such as a photoresist material. The excess photoresist material, conductive layer material, and barrier layer material located external to the aperture are then removed using chemical-mechanical planarization or polishing (CMP). The capacitor is then disposed within the photoresist material in the aperture and coupled to other features of the microelectronic substrate with an overlying network of vias and lines.

One drawback with the foregoing container technique for forming capacitors is that during the CMP process, small particles of the conductive material removed from the conductive layer can become embedded in the photoresist material within the aperture. The embedded conductive material can cause short circuits and/or other defects in the capacitor that is subsequently formed in the aperture, causing the capacitor to fail. A further drawback is that high downforces are typically required during CMP processing to remove the conductive material external to the apertures. The high downforce can cause the conductive material adjacent to one aperture to smear into the conductive material of the adjacent aperture, which can in turn cause the adjacent containers to be short circuited to each other.

SUMMARY

The present invention is directed toward methods and apparatuses for chemically, mechanically, and/or electrolytically removing material from microelectronic substrates. A polishing medium in accordance with one aspect of the invention includes a polishing liquid having a liquid carrier and an electrolyte disposed in the liquid carrier. The electrolyte can transmit an electrical current between an electrode and the microelectronic substrate to electrolytically remove conductive material from the microelectronic substrate. The polishing liquid can further include abrasives (such as colloidal abrasives) disposed in the liquid carrier, with the abrasives forming up to about 1% of the polishing liquid by weight. The presence of the electrolyte in the polishing liquid can provide for electrolytic material removal at reduced downforce levels.

In a further aspect of the invention, the abrasives can form up to about 0.5% of the polishing liquid, by weight, and can include colloidal silica and/or colloidal alumina. The polishing liquid can further include a chelating agent, such as ammonium hydroxide and/or ammonium chloride.

A method in accordance with one aspect of the invention includes engaging a microelectronic substrate with a polishing surface of a polishing pad and disposing a polishing liquid adjacent to the polishing surface and the microelectronic substrate, with the polishing liquid including an electrolyte and up to about 1% abrasive particles by weight. The method can further include passing a variable electrical current through the polishing liquid to the microelectronic substrate from at least one electrode spaced apart from the microelectronic substrate, and moving at least one of the polishing pad and the microelectronic substrate relative to the other to remove material from the microelectronic substrate.

A method in accordance with another aspect of the invention includes contacting the microelectronic substrate with a polishing surface of a polishing pad, disposing an electrolytic liquid between the microelectronic substrate and the polishing surface of the polishing pad, and applying a force to at least one of microelectronic substrate and the polishing pad. The method can further include passing an electrical current through the electrolytic liquid between at least one electrode spaced apart from the microelectronic substrate and a conductive material of the microelectronic substrate, and selecting a level for one of the force and the electrical current based at least in part on a level for the other. At least part of the conductive material can then be removed from the microelectronic substrate by moving at least one of the microelectronic substrate and the polishing pad relative to the other.

In still a further aspect of the invention, a first portion of material can be removed from the microelectronic substrate by passing an electrical current between at least one electrode the microelectronic substrate, and a second portion of material can be removed from the microelectronic substrate without passing an electrical current through the conductive material. In a particular aspect of this method, the microelectronic substrate can be carried by the same carrier for electrolytic and nonelectrolytic processing. In another particular aspect of this method, the microelectronic substrate can be in contact with one polishing pad for electrolytic processing and another polishing pad for nonelectrolytic processing.

DETAILED DESCRIPTION

One approach (developed by the assignee of the present application) for addressing some of the foregoing drawbacks associated with container processes is to replace the conventional soft materials used to fill the containers with a harder material. For example, conventional photoresist materials can be replaced with phosphosilicate glass (PSG) or spin-on glass (SOG), and can be disposed in platinum-lined containers. Further details of materials and processes in accordance with this approach are disclosed in U.S. patent application Ser. No. 10/230,628, previously incorporated herein by reference.

One challenge presented by the use of platinum-lined, PSG filled containers is that relatively high CMP downforces are required to remove the platinum external to the containers, which can cause the platinum to smear into the regions between adjacent containers, even if the platinum does not become embedded in the PSG. Another challenge is that existing polishing liquids tend not to remove platinum and PSG uniformly. Such polishing liquids include tetramethyl ammonium hydroxide (TMAH) in combination with colloidal slurry particles, such as Klebasol products available from Rodell, Inc. of Phoenix, Ariz. In some cases, these polishing liquids can leave high spots of PSG, causing an uneven topography that may not be suitable for supporting microelectronic devices in the containers, and may not provide a suitable, planar foundation for subsequent structures.

The following disclosure describes methods and apparatuses for overcoming the foregoing potential drawbacks. Many specific details of certain embodiments of the invention are set forth in the following description and in FIGS. 1A–6 to provide a thorough understanding of these embodiments. One skilled in the art, however, will understand that the present invention may have additional embodiments and that the invention may be practiced without several of the details described below.

Figure 1A:
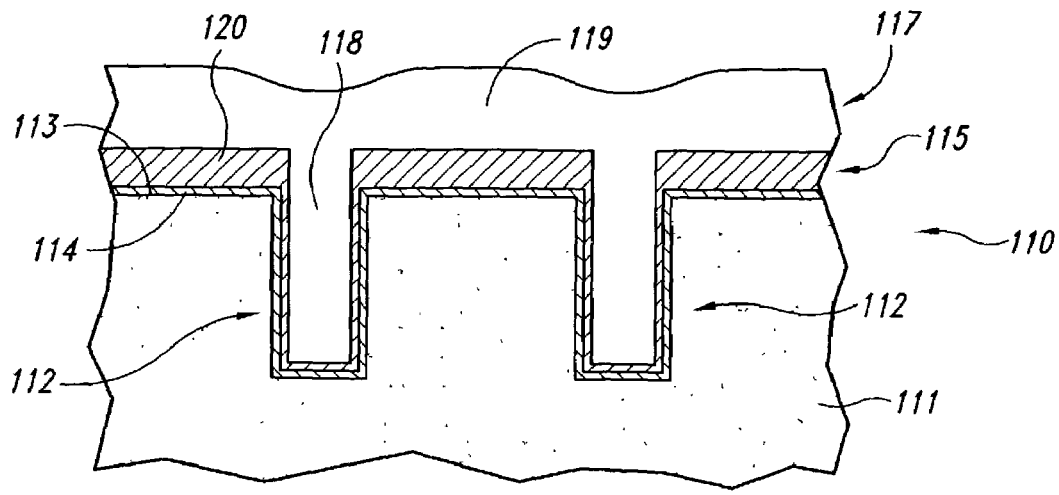
FIGS. 1A–1E schematically illustrate a process for forming features in a microelectronic substrate in accordance with an embodiment of the invention.

FIG. 1A is a partially schematic illustration of a microelectronic substrate 110 positioned for processing in accordance with an embodiment of the invention. In one aspect of this embodiment, the microelectronic substrate 110 includes a substrate material 111. This substrate material 111 can include borophososilicate glass (BPSG), tetraethyl orthosilicate (TEOS), undoped silicon dioxide or other suitable materials. In any of these embodiments, one or more apertures 112 (two of which are shown in FIG. 1A) can be formed in a substrate material plane 113 of the substrate material 111, using conventional techniques such as patterned etching. In one embodiment, the apertures 112 can be used to form container devices (such as capacitors) and in other embodiments, the apertures 112 can include trenches or holes for forming lines or vias. In one embodiment, the apertures 112 have a relatively high aspect ratio (i.e., depth-to-width ratio). For example, in one particular embodiment, the apertures 112 can have an aspect ratio of about 4:1 or more, and in other embodiments, the apertures 112 can have other aspect ratios. In any of these embodiments, an underlayer 114 (such as a tantalum or tantalum oxide layer) is disposed on the substrate material plane 113 and adjacent to the walls of the apertures 112. The underlayer 114 can be disposed on the microelectronic substrate 110 using conventional techniques, such as physical vapor deposition (PVD) or chemical vapor deposition (CVD). In one aspect of this embodiment, the underlayer 114 can form a barrier layer and in other embodiments, the underlayer 114 can perform other functions, such as promoting adhesion of subsequently deposited materials onto the walls of the apertures 112.

A layer of conductive material 115 can then be disposed on the underlayer 114. In one embodiment, the conductive material 115 can include platinum, and in other embodiments, the conductive material 115 can include other electrically conductive constituents, such as copper, or refractory metals, such as tantalum, tungsten and/or their nitrides. Platinum may be particularly suitable for apertures 112 having high aspect ratios, such as aspect ratios of approximately 4:1.

A fill material 117 can then be disposed on the conductive material 115. The fill material 117 can include subplane portions 118 (positioned beneath the substrate plane 113 in the apertures 112) and a first external portion 119 that extends outwardly away from the substrate material plane 113, external to the apertures 112. The first external portion 119 can be disposed on a second external portion 120 defined by the part of the conductive material 115 located external to the apertures 112 and beyond the substrate material plane 113. In one embodiment, the fill material 117 can include a relatively hard, generally nonconductive substance, such as PSG. In a specific aspect of this embodiment, the fill material 117 can include PSG having 6% phosphorous. In other embodiments, the fill material 117 can include other relatively hard PSG or non-PSG materials, such as SOG. In any of these embodiments, the fill material can have a hardness greater than that of a typical photoresist material. Accordingly, in one particular embodiment, the fill material 117 can have a hardness of about 0.04 GPa or higher. In a particular embodiment in which the fill material 117 includes 6% phosphorous PSG, the fill material 117 can have a hardness of about 6.5 GPa or higher.

Figure 1B:
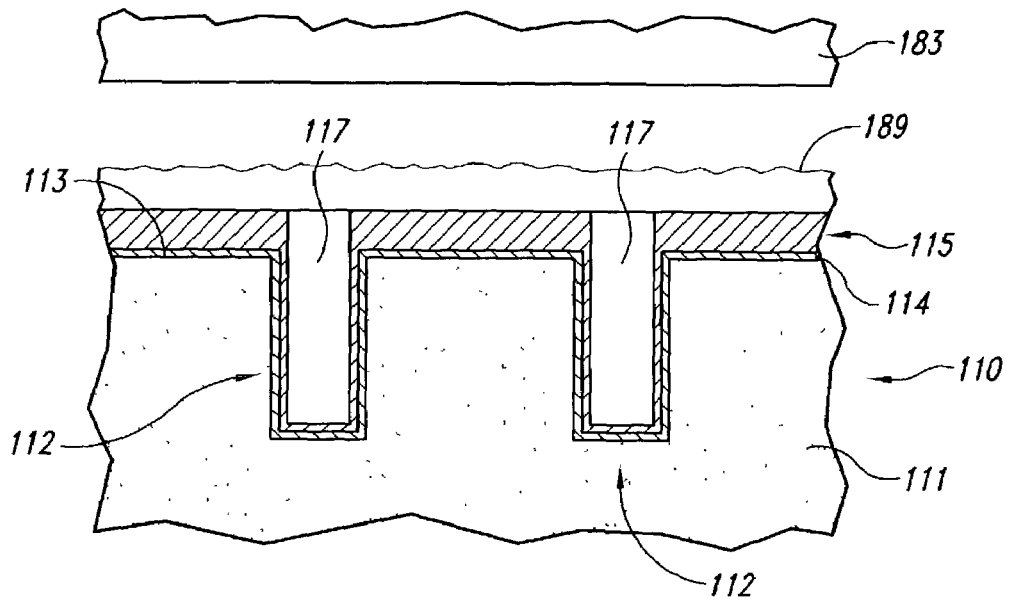

The first external portion 119 of the fill material 117 can be removed (as shown in FIG. 1B) so that the remaining fill material 117 is flush with the conductive material 115. In one aspect of this embodiment, conventional CMP techniques and slurries can be used to remove the first projection 119. Accordingly, the fill material 117 can be removed with a polishing pad 183 and a polishing liquid 189 disposed adjacent to the polishing pad 183 and the microelectronic substrate 110. Further details of apparatuses for removing the first projection 119 are described below with reference to FIGS. 3–6.

Figure 1C:
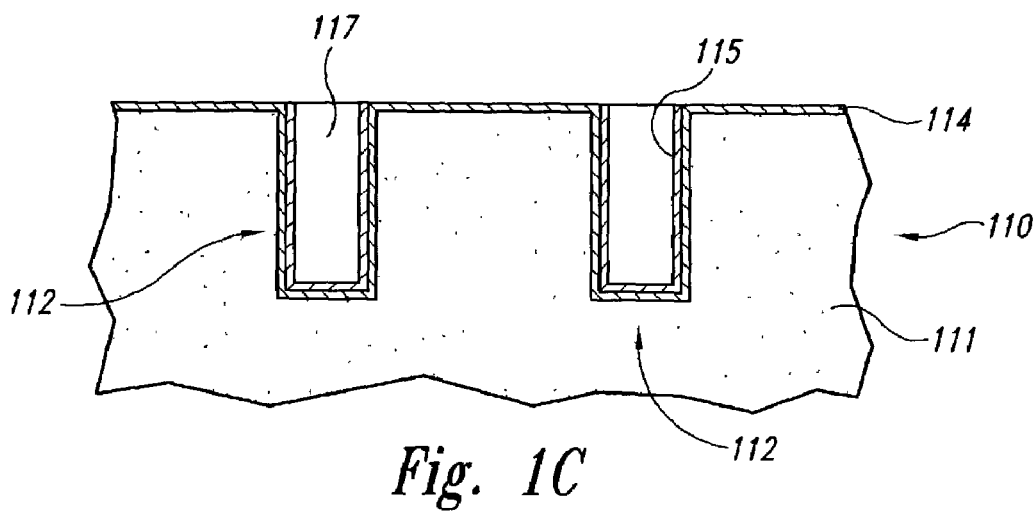

FIG. 1C is a schematic illustration of the microelectronic substrate 110 after the second external portion 120 (FIG. 1B) of the conductive material 115 has been removed, along with an adjacent portion of the fill material 117. Accordingly, both the fill material 117 and the conductive material 115 can be flush with the underlayer 114 at the conclusion of this process portion. The fill material 117 and conductive material 115 removed during this portion of the process can be removed using electrochemical-mechanical polishing (ECMP) techniques and an apparatus generally similar to that described in greater detail below with reference to FIGS. 3–6.

In one aspect of this embodiment, a polishing liquid 189a is positioned in contact with the microelectronic substrate 110 and is selected to include constituents that simultaneously remove both the fill material 117 and the conductive material 115. For example, the polishing liquid can include an electrolyte to conduct electrical current to the conductive material 115 for electrolytically removing the conductive material 115. The polishing liquid 189a can also include metal chelating agents that bind with metal ions removed from the microelectronic substrate 110 and accordingly aid in the removal of these ions. The polishing liquid 189a can still further include abrasive particles which can effectively increase the mechanical contact between the microelectronic workpiece 110 and the polishing pad 183.

One example of a polishing liquid 189a having the characteristics described above is a solution that has a pH of about 10 and includes 1.0 molar ammonium phosphate (($NH_4$)$_2HPO_4$) and 0.75 molar ammonium hydroxide ($NH_4OH$). The ammonium phosphate can provide the polishing liquid with electrolytic characteristics and can provide for a relatively high pH. The ammonium hydroxide can also provide for a relatively high pH and can provide $NH_3$ molecules that chelate metal ions from the microelectronic substrate 110. The solution can further include abrasive elements, such as diluted colloidal silica (silicon dioxide) particles that constitute from about 0.1% to about 1.0% of the polishing liquid, by weight. In one particular aspect of this embodiment, the colloidal silica particles can constitute about 0.5% of the polishing liquid 189a by weight, and in another embodiment, the colloidal silica particles can constitute about 0.2% of the polishing liquid 189a by weight. In any of these embodiments, the colloidal particles can be diluted significantly more than are conventional colloidal slurries, which typically have from about 2% to about 20% colloidal particles by weight. In any of these embodiments, the polishing liquid 189a can have a pH of about 10 to reduce and/or eliminate the likelihood for the colloidal silica particles to agglomerate while in solution.

In other embodiments, the polishing liquid 189a can have other compositions that also electrolytically conduct electrical currents to the microelectronic substrate 110, chelate metal ions removed from the microelectronic substrate 110, and include slurry particles for increased mechanical contact with the microelectronic substrate 110. One example of such a polishing liquid has a pH of about 4 with 1.0 molar ammonium sulfate ($NH_2SO_4$), 0.5 molar ammonium chloride ($NH_4Cl$), and 0.5% colloidal alumina (aluminum oxide) particles. In one aspect of this embodiment, the ammonium sulfate provides for conductivity and a relatively low pH, which is supported by the ammonium chloride. The ammonium chloride can also provide $NH_3$ molecules and $Cl^-$ ions for chelating metal ions from the microelectronic substrate 110. A low pH (such as a pH of 4) is suitable for preventing aluminum oxide particles from agglomerating in solution.

Figure 1D:
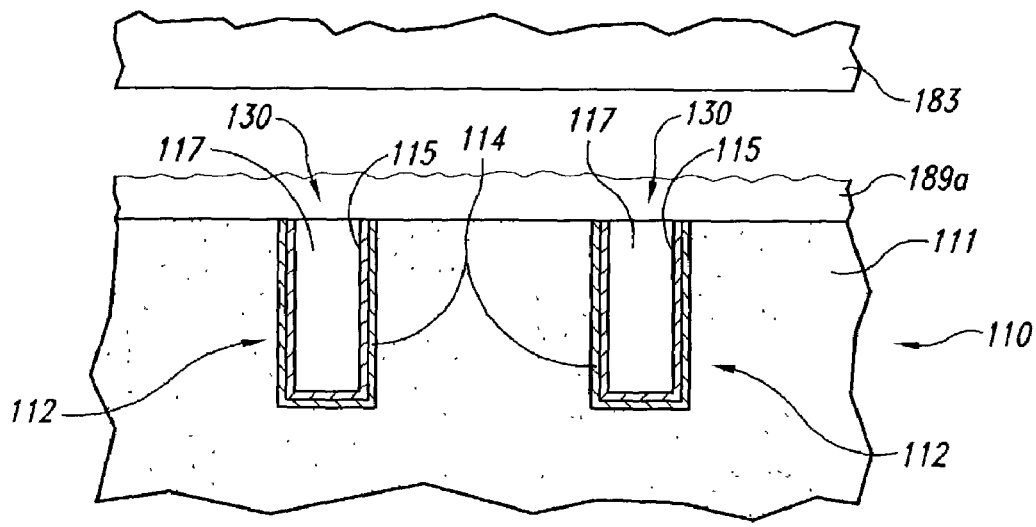
Figure 1E:
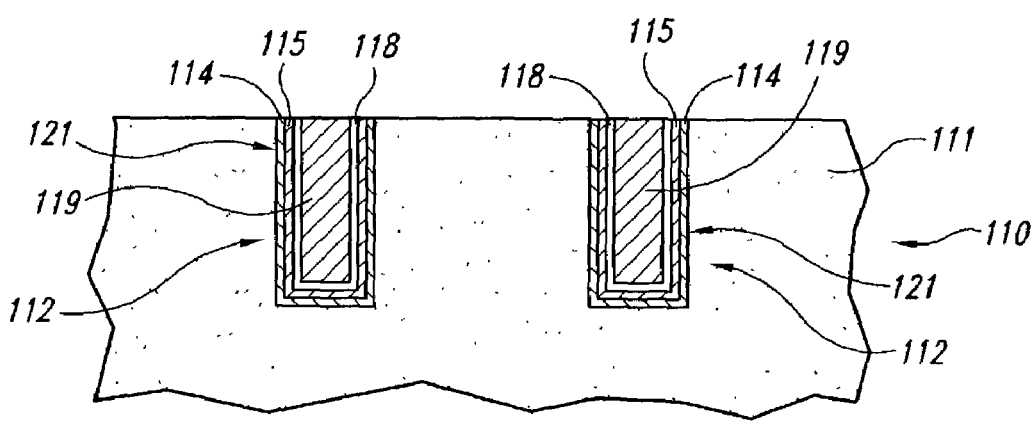

As shown in FIG. 1D, the underlayer 114 (FIG. 1C) can be removed in a subsequent step, resulting in the formation of containers 130 having the upper edges of the underlayer 114, the conductive material 115, and the fill material 117 all flush with the substrate material plane 113. At this point, each container 130 is electrically isolated and shielded from the surrounding structures in the microelectronic substrate 110. In one aspect of this embodiment, conventional alumina and/or silica based slurries are used to simultaneously remove the fill material 117, the conductive material 115, the under material 114, and a small amount of the substrate material 111 to form the containers 130. In other embodiments, other polishing liquids can be used to remove these materials.

As shown in FIG. 1F, further features (such as electrodes) can next be disposed in the containers 130 to form structures 121 such as capacitors. The features can be disposed in the containers 130 using conventional techniques (such as selective etching and deposition) and are electrically coupled to each other and/or to external contacts with a network of vias and/or lines, also formed with conventional techniques, such as damascene techniques. For example, in one embodiment, the remaining fill material 117 within the apertures 112 is removed. A film 118, formed from a material such as tantalum pentoxide, is then disposed in the apertures 112, and a conductive electrode 119 is disposed adjacent to the film 118 to form the capacitor. In other embodiments, the foregoing techniques can be used to form other features in the microelectronic substrate 110, such as trenches and/or conductive lines. In any of these embodiments, portions of the microelectronic substrate 110 can then be diced from the larger wafer of which they are a part for encapsulation and incorporation in electronic devices.

Figure 2A:
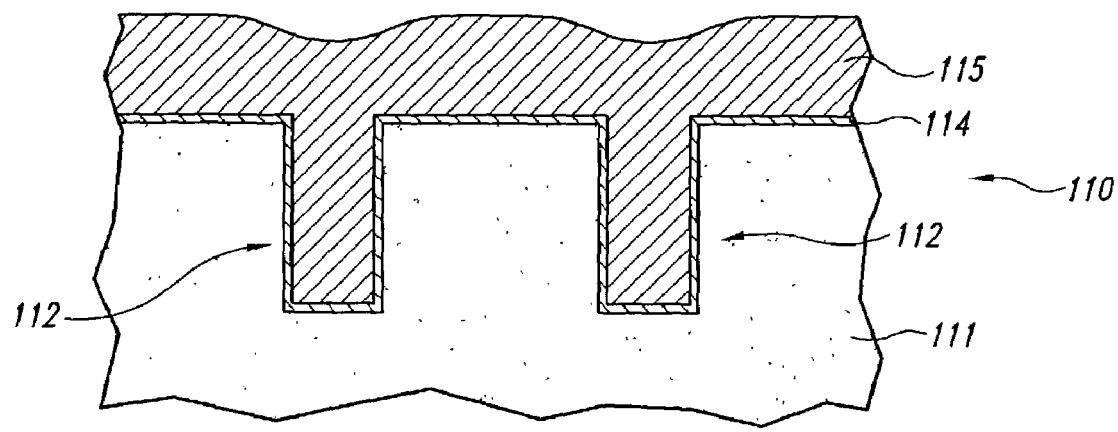
FIGS. 2A–2B schematically illustrate a process for forming conductive features in a microelectronic substrate in accordance with another embodiment of the invention.
Figure 2B:
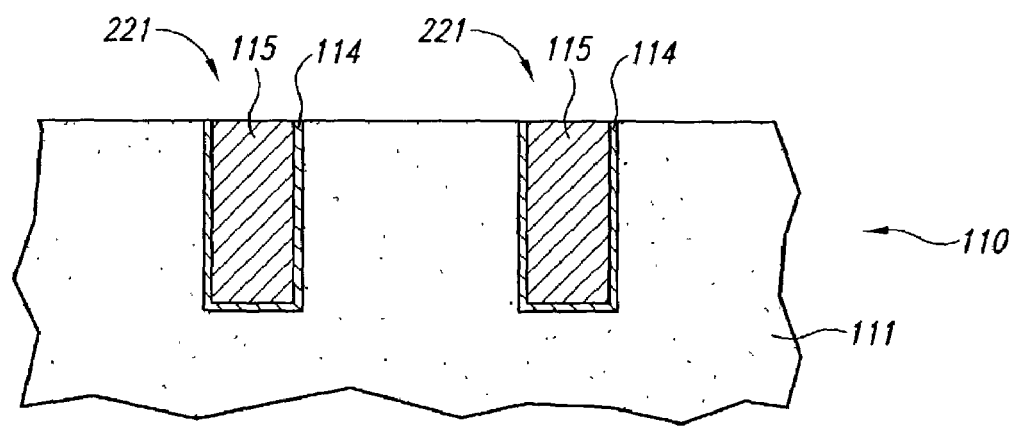

In other embodiments, the foregoing techniques can be used to process microelectronic substrates 110 having features other than the containers 130 described above. For example, as shown in FIGS. 2A–2B, the foregoing techniques can be used to process a microelectronic substrate 110 having conductive structures such as lines or vias formed directly in a substrate material. Beginning with FIG. 2A, the microelectronic substrate 110 can include a substrate material 111, such as a low-K dielectric material. An underlayer 114 (including materials such as a tantalum, tantalum oxide, tantalum nitride, tungsten, tungsten nitride or other refractory materials and/or their nitrides) is disposed in the apertures 112, and a conductive material 115 (such as copper) is disposed on the underlayer 114.

As shown in FIG. 2B, the portions of the conductive material 115 and the underlayer 114 external to the apertures 112 (which can include, for example, trenches or holes) can be removed to form conductive structures 221, such as lines or vias. In one aspect of this embodiment, a polishing liquid generally similar to the polishing liquids 189a described above with reference to FIG. 1C, but buffered to a pH of from about 6 to about 7, can be used to remove the conductive material 115. A conventional alumina or silica based slurry can be used to remove the underlayer 114 and conductive material is external to the apertures 112. In other embodiments, other polishing liquids can be used to remove these materials.

Figure 3:
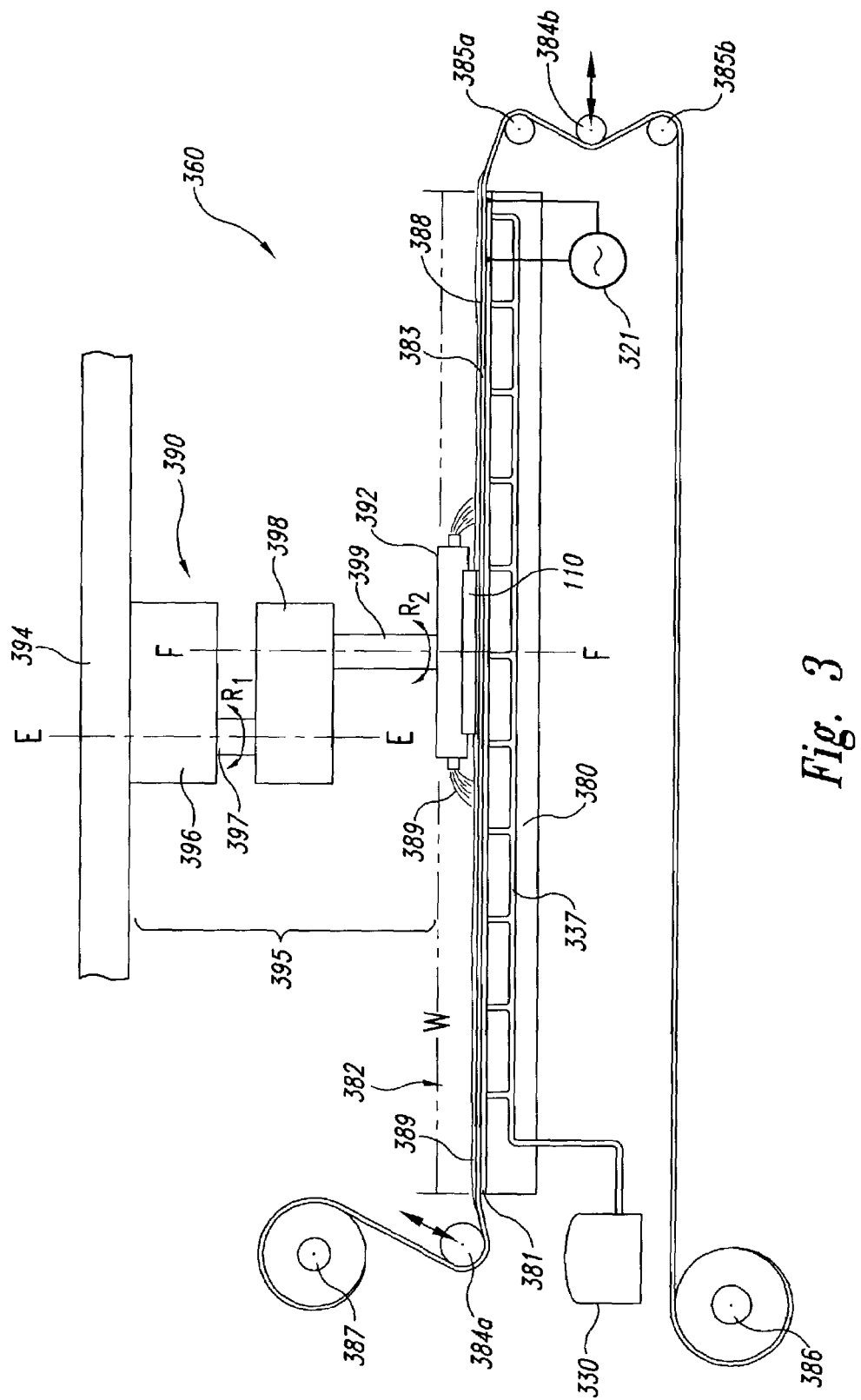
FIG. 3 is a partially schematic illustration of an apparatus for carrying out processes in accordance with embodiments of the invention.

FIGS. 3–6 schematically illustrate apparatuses for processing the microelectronic substrate 110 in a manner generally similar to that described above with reference to FIGS. 1A–2B. For example, FIG. 3 schematically illustrates an apparatus 360 for chemically-mechanically and/or electrochemically-mechanically polishing the microelectronic substrate 110 in accordance with an embodiment of the invention. In one aspect of this embodiment, the apparatus 360 has a support table 380 with a top-panel 381 at a workstation where an operative portion "W" of a polishing pad 383 is positioned. The top-panel 381 is generally a rigid plate to provide a flat, solid surface to which a particular section of the polishing pad 383 may be secured during polishing.

The apparatus 360 can also have a plurality of rollers to guide, position and hold the polishing pad 383 over the top-panel 381. The rollers can include a supply roller 387, first and second idler rollers 384a and 384b, first and second guide rollers 385a and 385b, and a take-up roller 386. The supply roller 387 carries an unused or preoperative portion of the polishing pad 383, and the take-up roller 386 carries a used or postoperative portion of the polishing pad 383. Additionally, the first idler roller 384a and the first guide roller 385a can stretch the polishing pad 383 over the top-panel 381 to hold the polishing pad 383 stationary during operation. A motor (not shown) drives at least one of the supply roller 387 and the take-up roller 386 to sequentially advance the polishing pad 383 across the top-panel 381. Accordingly, clean preoperative sections of the polishing pad 383 may be quickly substituted for used sections to provide a consistent surface for polishing and/or cleaning the microelectronic substrate 110.

The apparatus 360 can also have a carrier assembly 390 that controls and protects the microelectronic substrate 110 during polishing. The carrier assembly 390 can include a substrate holder 392 to pick up, hold and release the substrate 110 at appropriate stages of the polishing process. The carrier assembly 390 can also have a support gantry 394 carrying a drive assembly 395 that can translate along the gantry 394. The drive assembly 395 can have an actuator 396, a drive shaft 397 coupled to the actuator 396, and an arm 398 projecting from the drive shaft 397. The arm 398 carries the substrate holder 392 via a terminal shaft 399 such that the drive assembly 395 orbits the substrate holder 392 about an axis E—E (as indicated by arrow "$R_1$"). The terminal shaft 399 may also rotate the substrate holder 392 about its central axis F—F (as indicated by arrow "$R_2$")

The polishing pad 383 and a polishing liquid 389 define a polishing medium 382 that mechanically, chemically-mechanically, and/or electrochemically-mechanically removes material from the surface of the microelectronic substrate 110. In some embodiments, such as those described above with reference to FIGS. 1A–2B, the polishing pad 383 may be a nonabrasive pad without abrasive particles, and the polishing liquid 389 can be a slurry with abrasive particles and chemicals to remove material from the microelectronic substrate 110. In other embodiments, the polishing pad 383 can be a fixed-abrasive polishing pad in which abrasive particles are fixedly bonded to a suspension medium. To polish the microelectronic substrate 110 with the apparatus 360, the carrier assembly 390 presses the microelectronic substrate 110 against the polishing surface 388 of the polishing pad 383 in the presence of the polishing liquid 389. The drive assembly 395 then orbits the substrate holder 392 about the axis E—E and optionally rotates the substrate holder 392 about the axis F—F to translate the substrate 110 across the polishing surface 388. As a result, the abrasive particles and/or the chemicals in the polishing medium 382 remove material from the surface of the microelectronic substrate 110 in a chemical and/or chemical-mechanical polishing process.

In a further aspect of this embodiment, the polishing liquid 389 can include an electrolyte for ECMP processing. In another embodiment, the apparatus 360 can include an electrolyte supply vessel 330 that delivers an electrolyte separately to a polishing surface 388 of the polishing pad 383 with a conduit 337, as described in greater detail below with reference to FIG. 4. In either embodiment, the apparatus 360 can further include a current supply 321 coupled to electrodes positioned proximate to the polishing pad 383. Accordingly, the apparatus 360 can electrolytically remove material from the microelectronic substrate 110.

Figure 4:
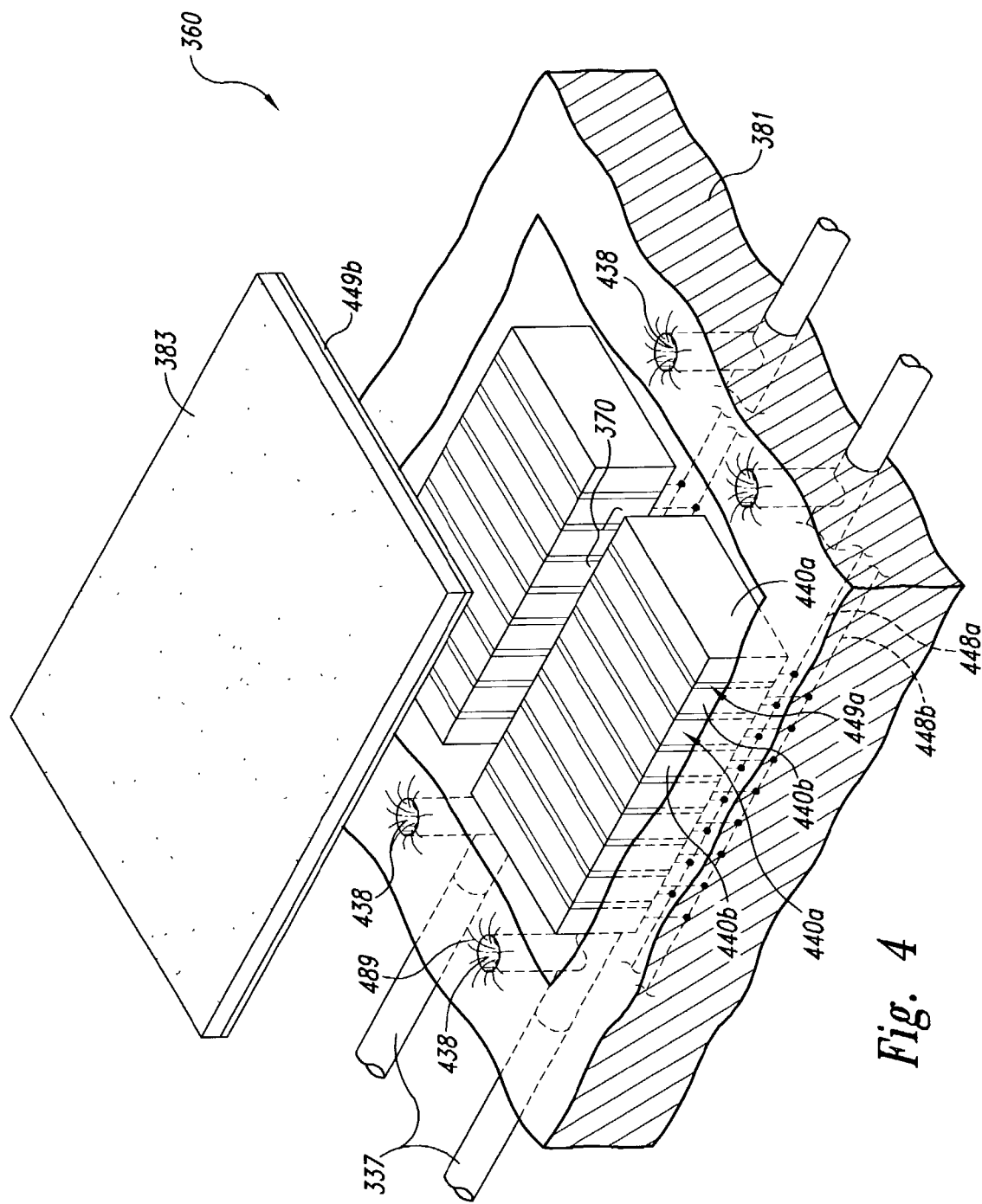
FIG. 4 is a partially schematic, isometric view of a portion of the apparatus shown in FIG. 3 in accordance with an embodiment of the invention.

FIG. 4 is a partially exploded, partially schematic isometric view of a portion of the apparatus 360 described above with reference to FIG. 3. In one aspect of the embodiment shown in FIG. 4, the top-panel 381 houses a plurality of electrode pairs 470, each of which includes a first electrode 440a and a second electrode 440b. The first electrodes 440a are coupled to a first lead 448a and the second electrodes 440b are coupled to a second lead 448b. The first and second leads 448a and 448b are coupled to the current supply 321 (FIG. 3). In one aspect of this embodiment, the first electrodes 440a can be separated from the second electrodes 440b by an electrode dielectric layer 449a that includes Teflon™ or another suitable dielectric material. The electrode dielectric layer 449a can accordingly control the volume and dielectric constant of the region between the first and second electrodes 440a and 440b to control the electrical coupling between the electrodes.

The electrodes 440a and 440b can be electrically coupled to the microelectronic substrate 110 (FIG. 3) by the polishing pad 383. In one aspect of this embodiment, the polishing pad 383 is saturated with an electrolyte 431 supplied by the supply conduits 337 through apertures 438 in the top-panel 381 just beneath the polishing pad 383. Accordingly, the electrodes 420a and 420b are selected to be compatible with the electrolyte 431. In an another arrangement, the electrolyte 431 can be supplied to the polishing pad 383 from above (for example, by disposing the electrolyte 431 in the polishing liquid 389, rather than by directing the electrolyte upwardly through the polishing pad 383). Accordingly, the apparatus 360 can include a pad dielectric layer 449b positioned between the polishing pad 383 and the electrodes 440a and 440b. When the pad dielectric layer 449b is in place, the electrodes 440a and 440b are isolated from physical contact with the electrolyte 431 and can accordingly be selected from materials that are not necessarily compatible with the electrolyte 431.

In one aspect of this embodiment, both electrodes 440a, 440b can be spaced apart from the microelectronic substrate 110. In another embodiment, one electrode can be spaced apart from the microelectronic substrate 110 and the other electrode can contact a conductive portion of the microelectronic substrate 110 (such as a back side of the substrate 110) that is electrically coupled via internal conductive lines to the front surface of the substrate 110 in contact with the polishing pad 383. In either embodiment, the electrodes 440a, 440b can transmit an electrical current to the front surface of the substrate 110 without directly contacting the front surface.

Figure 5:
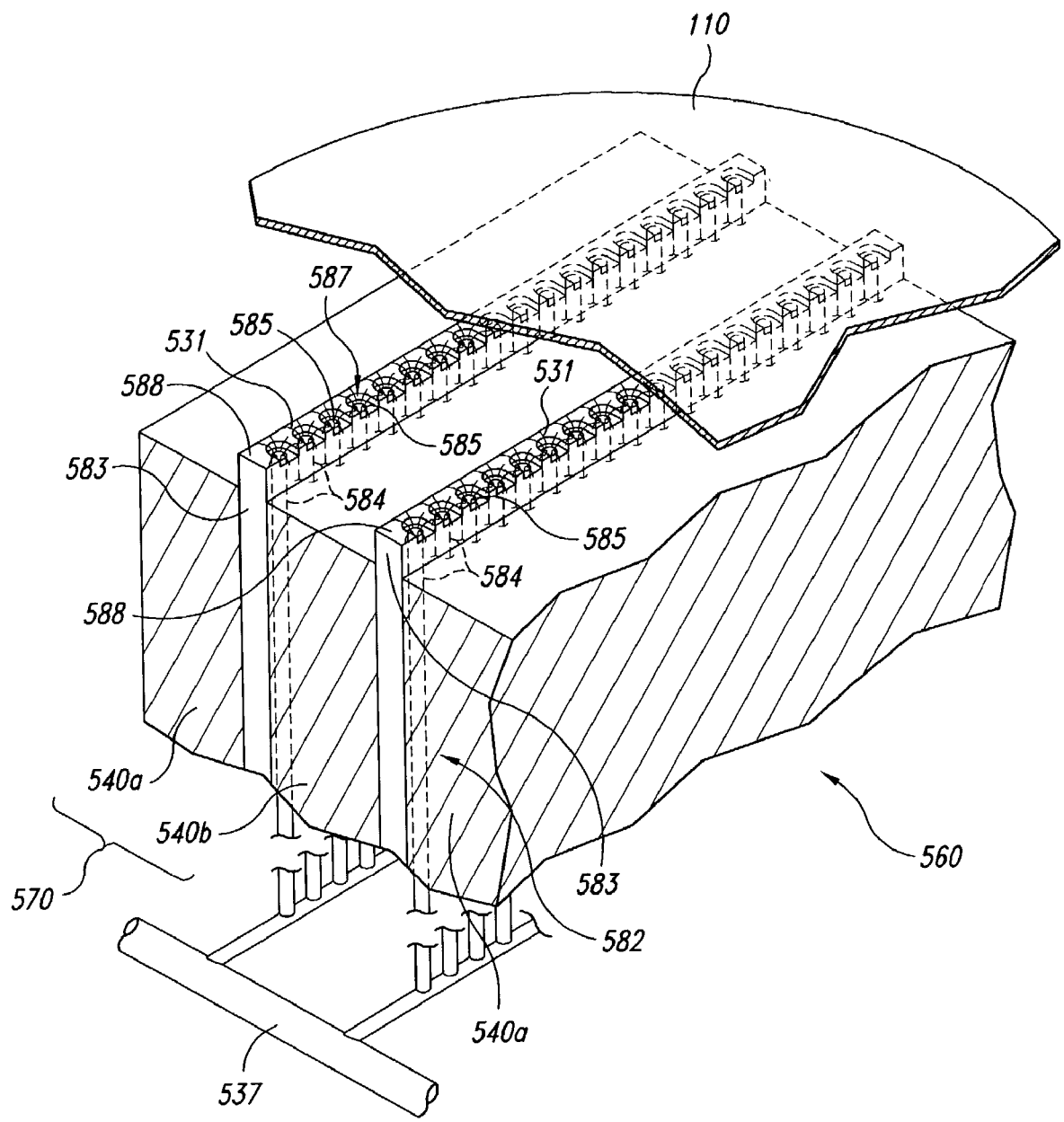
FIG. 5 is a partially schematic, side elevation view of an apparatus for processing a microelectronic substrate in accordance with another embodiment of the invention.

FIG. 5 is an isometric view of a portion of an apparatus 560 having electrodes 540 (shown as a first electrode 540a and a second electrode 540b), and a polishing medium 582 arranged in accordance with another embodiment of the invention. In one aspect of this embodiment, the polishing medium 582 includes polishing pad portions 583 that project beyond the electrodes 540a and 540b. Each polishing pad portion 583 can include a polishing surface 588 and a plurality of flow passages 584 coupled to a fluid source (not shown in FIG. 5) with a conduit 537. Each flow passage 584 can have an aperture 585 proximate to the polishing surface 588 to provide an electrolyte 531 proximate to an interface between the microelectronic substrate 110 and the polishing surface 588. In one aspect of this embodiment, the pad portions 583 can include recesses 587 surrounding each aperture 585. Accordingly, the electrolyte 531 can proceed outwardly from the flow passages 584 while the microelectronic substrate 110 is positioned directly overhead and remains spaced apart from the electrodes 540.

Figure 6:
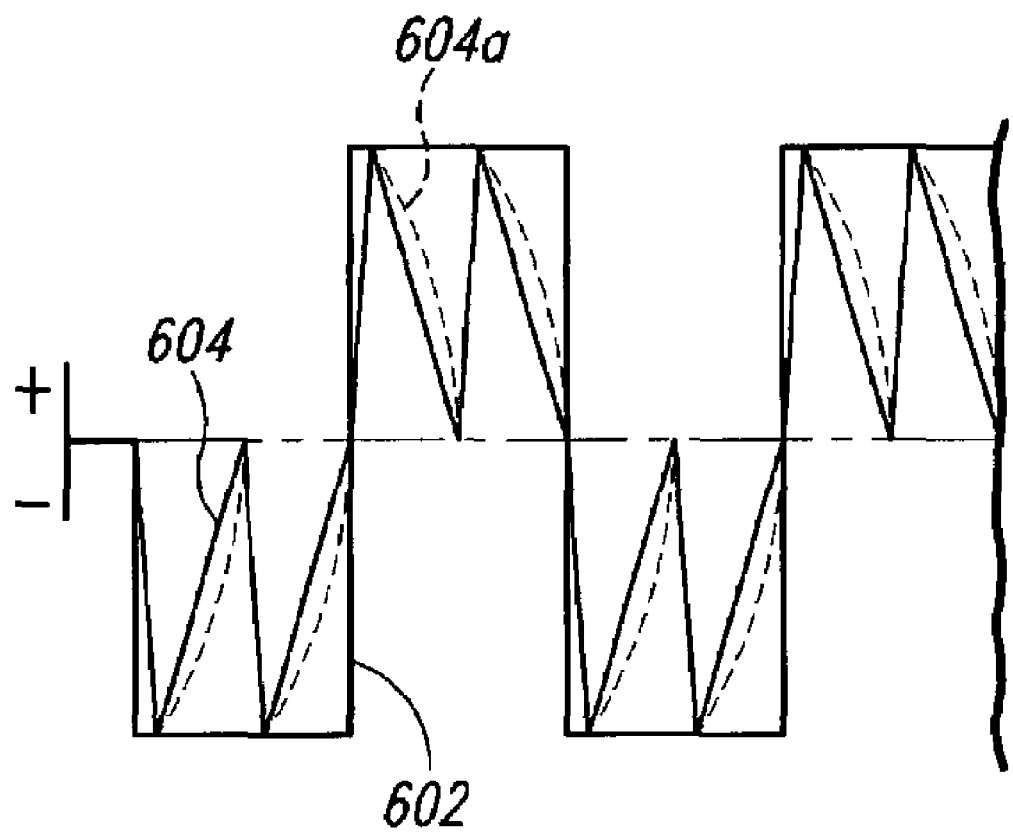
FIG. 6 schematically illustrates a waveform for electrolytically processing a microelectronic substrate in accordance with another embodiment of the invention.

Any of the foregoing apparatuses described above with reference to FIGS. 3–5 can be used to chemically-mechanically process the microelectronic substrate 110, and/or electrochemically-mechanically process the microelectronic substrate 110. When the apparatuses are used to electrochemically-mechanically process the microelectronic substrate 110, they can provide a varying electrical current that passes from the electrodes, through the conductive material of the microelectronic substrate 110 via the electrolytic fluid without contacting the electrodes with the microelectronic substrate 110. For example, as shown in FIG. 6, the apparatus can generate a high-frequency wave 604 and can superimpose a low-frequency wave 602 on the high-frequency wave 604. In one aspect of this embodiment, the high-frequency wave 604 can include a series of positive or negative voltage spikes contained within a square wave envelope defined by the low-frequency wave 602. Each spike of the high-frequency wave 604 can have a relatively steep rise-time slope to transfer charge through the dielectric material to the electrolyte and a more gradual fall-time slope. The fall-time slope can define a straight line, as indicated by high-frequency wave 604, or a curved line, as indicated by high-frequency wave 604a. In other embodiments, the high-frequency wave 604 and the low-frequency wave 602 can have other shapes depending, for example, on the particular characteristics of the dielectric material and the electrolyte, the characteristics of the microelectronic substrate 110, and/or the target rate at which conductive material is to be removed from the microelectronic substrate 110.

The methods described above with reference to FIGS. 1A–6 may be performed with the apparatuses described above with reference to FIGS. 3–6 in a variety of manners in accordance with several embodiments of the invention. For example, in one embodiment, a separate apparatus can be used to perform each of the three processes described above with reference to FIGS. 1B, 1C, and 1D, respectively. In a particular aspect of this embodiment, the microelectronic substrate 110 can be placed on a first apparatus (such as the apparatus 360) while a polishing liquid particularly suited for removing the fill material 117 is disposed between the polishing medium 382 and the microelectronic substrate 110. When the fill material 117 has been removed down to the level of the conductive material 115, the microelectronic substrate 110 can be moved to another apparatus (also generally similar to the apparatus 360) and a new polishing liquid can be disposed between the microelectronic substrate and the polishing medium. In a further aspect of this embodiment, the new polishing liquid can include an electrolyte for removing the conductive material 115. Once the conductive material 115 is removed down to the level of the underlayer 114, the microelectronic substrate 110 can be moved to a third apparatus (which can also be generally similar to the apparatus 360) and a third polishing liquid can be disposed between the microelectronic substrate and the polishing medium to remove the underlayer 114.

In one aspect of the foregoing embodiment, the microelectronic substrate 110 can remain with a single carrier 392 as it is moved from one apparatus to another. One characteristic that makes this feature possible is that, in one embodiment, the electrodes used for electrolytically processing the microelectronic substrate 110 are not in direct physical contact with either the microelectronic substrate 110 or the carrier 392 during processing in accordance with an embodiment of the invention. Accordingly, the same carrier 392 can be used for non-electrolytic processing (for example, when the fill material 117 and the underlayer 114 are removed) and electrolytic processing (for example, when the conductive material 115 is removed). An advantage of this arrangement is that the number of times the microelectronic substrate 110 must be moved from one carrier to another can be reduced and/or eliminated during this processing sequence, reducing the likelihood for damaging the microelectronic substrate 110.

In another embodiment, the same apparatus 360 can be used for some or all of the processes described above. For example, in one embodiment, the same polishing liquid can be used to remove the fill material 117 (as described above with reference to FIG. 1B) and the conductive material 115 (as described above with reference to FIG. 1C). In one aspect of this embodiment, an electrical current can be passed through the polishing liquid and the conductive material of the microelectronic substrate 110 when appropriate, for example, when removing material that is largely comprised of electrically conductive constituents. The electrical current can be reduced and/or halted when appropriate, for example, when removing material that is largely comprised of nonconductive constituents.

In other embodiments, other combinations of processes can be completed with the same polishing liquid. In any of the foregoing embodiments, the downforce applied to the microelectronic substrate 110 can be selected based on the electrical current applied to the microelectronic substrate, and/or vice versa. The particular values chosen for the downforce and the electrical current can be selected based upon the desired result to be achieved by the process. For example, to avoid smearing the conducive material 115, the downforce can be selected to be relatively low and the current applied to the microelectronic substrate can be selected to be relatively high. Conversely, when smearing is not as great a concern (for example, when removing the underlayer 114), the downforce can be increased and the electrical current reduced.

In other embodiments, other characteristics of the material removal process can be adjusted. For example, when it is desirable to remove the nonconductive fill material 117 (by chemical-mechanical action) and the conductive material 115 (by electrochemical-mechanical action) simultaneously and at approximately the same rate, the concentration of slurry particles can be increased (relative to the concentration when only the fill material 117 is removed) so that the removal of the fill material 117 keeps pace with the removal of the conductive material 115. In another aspect of this embodiment, the concentration of the chelating agent can be adjusted to adjust the rate with which the conductive material 115 is removed.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method for removing material from a microelectronic substrate, comprising:
    engaging a microelectronic substrate with a polishing surface of a polishing pad;
    disposing a polishing liquid adjacent to the polishing surface and the microelectronic substrate, the polishing liquid including an electrolyte and abrasive elements, the polishing liquid having up to about 1% abrasive elements by weight;

removing material from the microelectronic substrate by passing a varying electrical current through the polishing liquid and through a conductive material of the microelectronic substrate from a first electrode spaced apart from the microelectronic substrate to a second electrode spaced apart from the first electrode and the microelectronic substrate and moving at least one of the polishing pad and the microelectronic substrate relative to the other.

2. The method of claim 1 wherein disposing a polishing liquid includes disposing a polishing liquid having from about 0.1% to about 0.5% colloidal particles by weight.

3. The method of claim 1 wherein disposing a polishing liquid includes disposing a polishing liquid having a chelating agent that includes at least one of ammonia and chloride.

4. The method of claim 1 wherein removing material from the microelectronic substrate includes removing platinum from the microelectronic substrate, and wherein the method further includes binding the chelating agent to platinum ions.

5. The method of claim 1 wherein copper from the microelectronic substrate, and wherein the method further includes binding the chelating agent to copper ions.

6. The method of claim 1 wherein removing material from the microelectronic substrate includes removing tantalum, tantalum nitride, tungsten or tungsten nitride from the microelectronic substrate.

7. The method of claim 1 wherein disposing a polishing liquid adjacent to the polishing surface and the microelectronic substrate includes disposing an acidic polishing liquid.

8. The method of claim 1 wherein disposing a polishing liquid adjacent to the polishing surface and the microelectronic substrate includes disposing an alkaline polishing liquid.

9. The method of claim 1 wherein disposing a polishing liquid adjacent to the polishing surface and the microelectronic substrate includes disposing an electrolyte that includes ammonium phosphate.

10. The method of claim 1 wherein disposing a polishing liquid adjacent to the polishing surface and the microelectronic substrate includes disposing an electrolyte that includes ammonium sulfate.

11. The method of claim 1 wherein disposing a polishing liquid adjacent to the polishing surface and the microelectronic substrate includes disposing a chelating agent that includes ammonium hydroxide.

12. The method of claim 1 wherein disposing a polishing liquid adjacent to the polishing surface and the microelectronic substrate includes disposing a chelating agent that includes ammonium chloride.

13. The method of claim 1 wherein disposing a polishing liquid includes disposing a polishing liquid adjacent to a conductive material in a trench of the microelectronic substrate.

14. A method for removing material from a microelectronic substrate, comprising:

engaging a microelectronic substrate with a polishing surface of a polishing pad;

disposing a polishing liquid adjacent to the polishing surface and the microelectronic substrate, the polishing liquid including an electrolyte, a chelating agent and a dilute colloidal slurry, the polishing liquid having up to about 1% colloidal particles by weight;

removing material from the microelectronic substrate by passing a varying electrical current through the polishing liquid and through a conductive material of the microelectronic substrate from a first electrode spaced apart from the microelectronic substrate to a second electrode spaced apart from the first electrode and the microelectronic substrate, and moving at least one of the polishing pad and the microelectronic substrate relative to the other.

15. The method of claim 14 wherein disposing a polishing liquid includes disposing a polishing liquid having from about 0.1% to about 0.5% colloidal particles by weight.

16. The method of claim 14 wherein disposing a polishing liquid includes disposing a polishing liquid having a chelating agent that includes at least one of ammonia and chloride.

17. The method of claim 14 wherein removing material from the microelectronic substrate includes removing platinum from the microelectronic substrate, and wherein the method further includes binding the chelating agent to platinum ions.

18. The method of claim 14 wherein removing material from the microelectronic substrate includes removing copper from the microelectronic substrate, and wherein the method further includes binding the chelating agent to copper ions.

19. The method of claim 14 wherein disposing a polishing liquid adjacent to the polishing surface and the microelectronic substrate includes disposing an acidic polishing liquid.

20. The method of claim 14 wherein disposing a polishing liquid adjacent to the polishing surface and the microelectronic substrate includes disposing an alkaline polishing liquid.

21. The method of claim 14 wherein disposing a polishing liquid adjacent to the polishing surface and the microelectronic substrate includes disposing an electrolyte that includes ammonium phosphate.

22. The method of claim 14 wherein disposing a polishing liquid adjacent to the polishing surface and the microelectronic substrate includes disposing an electrolyte that includes ammonium sulfate.

23. The method of claim 14 wherein disposing a polishing liquid adjacent to the polishing surface and the microelectronic substrate includes disposing a chelating agent that includes ammonium hydroxide.

24. The method of claim 14 wherein disposing a polishing liquid adjacent to the polishing surface and the microelectronic substrate includes disposing a chelating agent that includes ammonium chloride.

25. A method for removing material from a microelectronic substrate, comprising:

engaging a microelectronic substrate with a polishing surface of a polishing pad, the microelectronic substrate having a dielectric material with an aperture, a first layer of a first material disposed in the aperture, and a second layer of a second material disposed in the aperture on the first layer;

disposing a polishing liquid adjacent to the polishing surface and the microelectronic substrate, the polishing liquid including an electrolyte, a chelating agent and a dilute colloidal slurry;

removing the first and second materials from the microelectronic substrate by passing a varying electrical current through the polishing liquid and through at least one of the first and second materials of the microelectronic substrate from a first electrode spaced apart from the microelectronic substrate to a second electrode spaced apart from the first electrode and the microelectronic substrate, and moving at least one of the polishing pad and the microelectronic substrate relative to the other.

26. The method of claim 25 wherein removing the first and second materials includes removing platinum and phosphosilicate glass.

27. The method of claim 25 wherein removing the first and second materials includes removing a refractory metal and copper.

28. The method of claim 25, further comprising disposing a microelectronic feature in the aperture.

29. The method of claim 25, further comprising disposing an electrode in the aperture.

30. The method of claim 25 wherein the first material includes a conductive material and wherein the second material includes a generally non-conductive material, and wherein the method further comprises disposing an underlayer between the conductive material and a wall of the aperture.

31. The method of claim 25 wherein disposing a polishing liquid includes disposing a polishing liquid having up to about 1% colloidal particles, by weight.

32. A method for removing material from a microelectronic substrate, comprising:
    contacting the microelectronic substrate with a polishing surface of a polishing pad;
    disposing an electrolytic liquid adjacent to the microelectronic substrate and the polishing surface of the polishing pad;
    applying a force to at least one of the microelectronic substrate and the polishing pad, the force being directed toward the other of the microelectronic substrate and the polishing pad;
    passing a variable electrical current through the electrolytic liquid between at least one electrode spaced apart from the microelectronic substrate and a conductive material of the microelectronic substrate;
    selecting a level for one of the force and the electrical current based at least in part on a level for the other; and
    removing at least part of the conductive material from the microelectronic substrate by moving at least one of the microelectronic substrate and the polishing pad relative to the other.

33. The method of claim 32 wherein selecting one of the level of the force and the electrical current includes selecting the force to have a relatively low value when the electrical current has a relatively high value.

34. The method of claim 32, further comprising selecting a first force level for the force and a first current level for the electrical current for removing at least part of the conductive material from the microelectronic substrate and selecting a second force level for the force and a second current level for the electrical current for removing at least part of a generally non-conductive material from the microelectronic substrate, wherein the first force level is less than the second force level, and wherein the first current level is greater than the second current level.

35. The method of claim 32 wherein the conductive material is a first material and the electrolytic liquid is a first liquid, and wherein the method further comprises disposing a second liquid different than the first liquid adjacent to a second material of the microelectronic substrate, the second material being different from the first material.

36. The method of claim 32 wherein disposing an electrolytic liquid includes disposing an electrolytic liquid that includes a chelating agent.

37. The method of claim 32 wherein disposing an electrolytic liquid includes disposing an electrolytic liquid having dilute colloidal particles.

38. The method of claim 32 wherein disposing an electrolytic liquid includes disposing an electrolytic liquid having abrasive elements.

39. The method of claim 32 wherein passing an electrical current includes passing an electrical current from a first electrode spaced apart from the microelectronic substrate, through the electrolytic liquid to the conductive material of the microelectronic substrate, to a second electrode spaced apart from the microelectronic substrate and the first electrode.

40. The method of claim 32 wherein removing at least part of the conductive material includes removing conductive material from a trench in the microelectronic substrate.

41. A method for processing a microelectronic substrate, comprising:
    positioning the microelectronic substrate proximate to and spaced apart from a first electrode and a second electrode;
    contacting a surface of the microelectronic substrate with a polishing surface of a polishing pad;
    disposing an electrolyte adjacent to the microelectronic substrate and the polishing surface of the polishing pad;
    removing a first portion of material from the microelectronic substrate by passing a varying electrical current through the electrolyte from the first electrode through a conductive material of the microelectronic substrate and to the second electrode while moving at least one of the microelectronic substrate and the electrodes relative to the other and while the microelectronic substrate contacts the polishing pad; and
    removing a second portion of material from the microelectronic substrate by moving at least one of the microelectronic substrate and the polishing pad relative to the other while the microelectronic substrate contacts the polishing surface of the polishing pad without passing an electrical current through the electrolyte and the conductive material.

42. The method of claim 41 wherein removing a first portion includes removing a first portion of a first material and wherein removing a second portion includes removing a second portion of a second material having a composition different than a composition of the first material.

43. The method of claim 41, further comprising removing the first portion of material prior to removing the second portion of material.

44. The method of claim 41, further comprising removing the second portion of material prior to removing the first portion of material.

45. The method of claim 41 wherein a first portion of material and the second portion of material are removed while the microelectronic substrate is carried by a single carrier.

46. The method of claim 41 wherein removing a first portion of material includes removing at least one of platinum and copper from the microelectronic substrate.

47. The method of claim 41 wherein removing a second portion of material includes removing at least one of phosphosilicate glass, borophosphosilicate glass, tetraethylorthosilicate and a low-K dielectric material from the microelectronic substrate.

48. A method for processing a microelectronic substrate, comprising:
  carrying a microelectronic substrate with a carrier;
  contacting a surface of the microelectronic substrate with a first polishing surface of a first polishing pad;
  disposing a polishing liquid adjacent to the microelectronic substrate and the polishing surface;
  removing a first portion of material from the microelectronic substrate by moving at least one of the microelectronic substrate and the polishing pad relative to the other while the microelectronic substrate contacts the polishing surface;
  removing the microelectronic substrate from the first polishing pad while the microelectronic substrate is carried by the carrier;
  contacting the microelectronic substrate with a second polishing surface of a second polishing pad while the microelectronic substrate is carried by the carrier;
  positioning the microelectronic substrate proximate to and spaced apart from a first electrode and a second electrode, the first and second electrodes being spaced apart from each other;
  disposing an electrolyte between the electrodes and the microelectronic substrate; and
  removing a second portion of material from the microelectronic substrate by passing an electrical current from at least one of the electrodes through the electrolyte and the conductive material of the microelectronic substrate to the other electrode while moving at least one of the microelectronic substrate and the electrodes relative to the other and while the microelectronic substrate contacts the second polishing pad.

49. The method of claim 48, wherein contacting the microelectronic substrate with a second polishing surface of a second polishing pad includes contacting the microelectronic substrate with a second polishing pad having the first and second electrodes positioned at least proximate to the second polishing surface.

50. The method of claim 48 wherein removing a first portion of material includes removing the first portion of material prior to removing the second portion of material.

51. The method of claim 48 wherein the polishing liquid includes a first polishing liquid and wherein the method further comprises disposing a second polishing liquid between the microelectronic substrate and the polishing surface while passing the electrical current through the conductive material.

52. The method of claim 48 wherein removing a second portion of material includes removing at least one of platinum and copper from the microelectronic substrate.

53. The method of claim 48 wherein removing a first portion of material includes removing at least one of phosphosilicate glass, borophosphosilicate glass, tetraethylorthosilicate and a low-K dielectric material from the microelectronic substrate.

54. A method for processing a microelectronic substrate, comprising:
  contacting a surface of the microelectronic substrate with a polishing surface of a polishing pad;
  positioning the microelectronic substrate proximate to and spaced apart from a first electrode and a second electrode;
  disposing a polishing liquid adjacent to the microelectronic substrate and the polishing surface, the polishing liquid having an electrolyte;
  removing a first portion of material from the microelectronic substrate by moving at least one of the microelectronic substrate and the polishing pad relative to the other while the microelectronic substrate contacts the polishing surface and while passing a varying electrical current from the first electrode through the electrolyte and the conductive material of the microelectronic substrate to the second electrode; and
  removing a second portion of material from the microelectronic substrate by moving at least one of the microelectronic substrate and the electrodes relative to the other and while the microelectronic substrate contacts the polishing pad and without passing an electrical current between the at least one electrode and the conductive material of the microelectronic substrate.

55. The method of claim 54 wherein removing a first portion includes removing a first portion of a first material and wherein removing a second portion includes removing a second portion of a second material having a composition different than a composition of the first material.

56. The method of claim 54 wherein removing the first portion of material includes removing the first portion of material prior to removing the second portion of material.

57. The method of claim 54 wherein the polishing liquid includes a first polishing liquid and wherein the method further comprises disposing a second polishing liquid between the microelectronic substrate and the polishing surface while passing the electrical current through the conductive material.

58. The method of claim 54 wherein removing a first portion of material includes removing at least one of platinum and copper.

59. The method of claim 54 wherein removing a second portion of material includes removing at least one of phosphosilicate glass, borophosphosilicate glass, tetraethylorthosilicate and a low-K dielectric material from the microelectronic substrate.

* * * * *